United States Patent
Byeon et al.

(10) Patent No.: US 6,888,756 B2
(45) Date of Patent: May 3, 2005

(54) LOW-VOLTAGE NON-VOLATILE SEMICONDUCTOR MEMORY DEVICE

(75) Inventors: Dae-Seok Byeon, Seoul (KR); June Lee, Seoul (KR); Gyung-Han Lee, Daegu-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 46 days.

(21) Appl. No.: 10/376,615

(22) Filed: Feb. 28, 2003

(65) Prior Publication Data

US 2003/0174539 A1 Sep. 18, 2003

(30) Foreign Application Priority Data

Mar. 4, 2002 (KR) ........................... 2002-11275

(51) Int. Cl.$^7$ ............................................. G11C 16/04
(52) U.S. Cl. ........................ 365/185.18; 365/185.21; 365/185.23
(58) Field of Search ................ 365/185.18, 185.21, 365/185.23

(56) References Cited

U.S. PATENT DOCUMENTS

| | | | |
|---|---|---|---|
| 5,677,873 A | 10/1997 | Choi et al. | |
| 5,715,194 A | 2/1998 | Hu | |
| 5,949,727 A | * 9/1999 | Choi et al. | 365/203 |
| 5,991,202 A | 11/1999 | Derhacobian et al. | |
| 6,049,493 A | * 4/2000 | Kitamoto et al. | 365/203 |
| 6,061,270 A | 5/2000 | Choi | |
| 6,064,611 A | * 5/2000 | Tanaka et al. | 365/203 |
| 6,212,120 B1 | * 4/2001 | Nakamura et al. | 365/227 |
| 6,330,178 B1 | * 12/2001 | Sakata et al. | 365/145 |

* cited by examiner

*Primary Examiner*—Hoai Ho
(74) *Attorney, Agent, or Firm*—Marger Johnson & McCollom, P.C.

(57) ABSTRACT

The disclosure is a non-volatile semiconductor memory device including a bias circuit that generates a bias voltage for controlling an NMOS transistor connected to both a bit line and a page buffer circuit. The bias circuit generates a first voltage, which is greater than a power source voltage, as the bias signal in a precharge period of a read operation. The bias circuit also generates a second voltage, which is less than the power source voltage, as the bias signal in a sensing period of the read operation.

7 Claims, 6 Drawing Sheets

US 6,888,756 B2

LOW-VOLTAGE NON-VOLATILE SEMICONDUCTOR MEMORY DEVICE

CROSS REFERENCE TO RELATED APPLICATIONS

This application claims priority under 35 USC §119 to an application entitled "Low-voltage non-volatile semiconductor memory device" filed in the Korean Industrial Property Office on Mar. 4, 2002 and assigned Serial No. 2002-11275, the contents of which are hereby incorporated by reference in their entirety for all purposes.

BACKGROUND OF THE INVENTION

1. Field of the Invention

Embodiments of the invention generally relate to semiconductor memory devices, and, more specifically, to low-voltage non-volatile semiconductor memory devices that use an internal voltage at a higher level than a power source voltage.

2. Description of the Related Art

Nowadays, as the operation voltage of semiconductor devices gradually decreases, the degree of integration of the semiconductor devices gradually increases. The decrease of the operation voltage increases the time required to precharge a bit line. As the degree of integration of semiconductor devices increases, the number of memory cells connected to the bit line also increases. This also increases the time required to precharge a bit line. Furthermore, the precharge voltage of the bit line also decreases in proportion to the decrease of the operation voltage, thereby reducing a drain-source voltage of a memory cell. Accordingly, the cell current flowing through the memory cell decreases along with the decrease of the drain-source voltage. This means that the length of time that it takes while the bit line voltage develops increases. As a result, the read time increases as the operation voltage is lowered.

SUMMARY OF THE INVENTION

Embodiments of the invention provide a low-voltage semiconductor memory device that can shorten the read time under a low power source voltage operation condition.

Embodiments of the invention will be better understood from the following detailed description of the exemplary embodiment thereof taken in conjunction with the accompanying drawings, and its scope will be pointed out in the appended claims.

BRIEF DESCRIPTION OF THE DRAWINGS

The foregoing and other objects, features and advantages of the invention will be apparent from the more particular description of an embodiment of the invention, as illustrated in the accompanying drawings in which like reference characters refer to the same parts throughout the different views. The drawings are not necessarily to scale, instead emphasis is placed upon illustrating the principles of the invention.

DETAILED DESCRIPTION OF THE INVENTION

It should be understood that the description of the exemplary embodiment is merely illustrative and should not be taken in a limiting sense. In the following detailed description, several specific details are set forth in order to provide a thorough understanding of the invention. It will be obvious, however, to one skilled in the art that the invention may be practiced without these specific details. Practical embodiments of the invention will now be explained in conjunction with the drawings.

Figure 1:
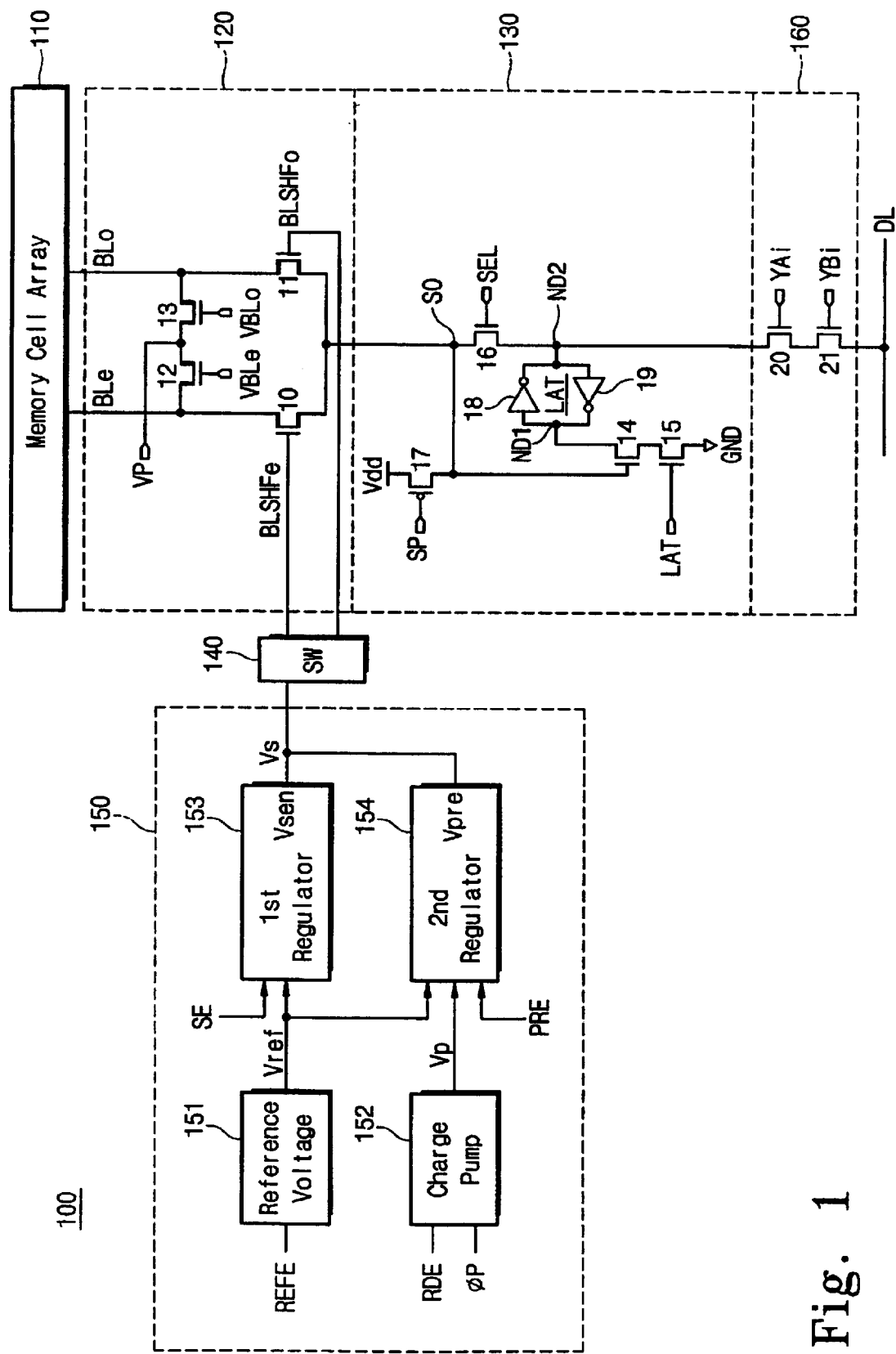
FIG. 1 is a block diagram of a non-volatile semiconductor memory device according to an embodiment of the invention.

FIG. 1 is a block diagram of a non-volatile semiconductor memory device according to an embodiment of the invention. Although the non-volatile semiconductor memory device 100 shown in FIG. 1 is a NAND flash memory device, it will be apparent to those skilled in the art that embodiments of the invention are not limited to NAND flash memory devices. The non-volatile semiconductor memory device 100 according to this embodiment includes a memory cell array 110. Although not shown in FIG. 1, the memory cell array 110 has a number of memory cells arranged in a matrix having rows (or word lines) and columns (or bit lines). Each column (or bit line) is connected to a cell string. Although not shown, the cell string includes a string selection transistor, a ground selection transistor, and a number of memory cell transistors connected in series between the string selection and ground selection transistors. The columns of the memory cells in the memory cell array 110 are connected to a bit line selecting and biasing circuit 120. For convenience of description, only two bit lines BLe and BLo together with elements related to them are shown in FIG. 1. The bit line selecting and biasing circuit 120 selects one bit line from among the bit lines BLe and BLo and electrically connects the selected bit line to a page buffer circuit 130.

The bit line selecting and biasing circuit 120 includes four NMOS transistors 10, 11, 12, and 13. The NMOS transistor 10 is connected to both the bit line BLe and the page buffer circuit 130 and is controlled by a control signal BLSHFe. The NMOS transistor 11 is connected to both the bit line BLo and the page buffer circuit 130 and is controlled by a control signal BLSHFo. The NMOS transistor 12 is connected to both the bit line BLe and a power supply line VP and is controlled by a control signal VBLe. The NMOS transistor 13 is connected to both the bit line BLo and the power supply line VP and is controlled by a control signal VBLo.

The control signals BLSHFo and BLSHFe are output from a switch circuit 140 which transfers a voltage output from a bias circuit 150 to one of the control signal lines BLSHFo and BLSHFe. For example, when the bit line BLe is selected, the switch circuit 140 transfers a voltage to the signal line BLSHFe from the bias circuit 150 during a precharge period of a read operation and transfers a voltage to the signal line BLSHFe from the bias circuit 150 during a sensing period of a read operation. The switch circuit 140 maintains the control signal lines BLSHFo and BLSHFe at a low level of the ground voltage during a developing period of the read operation.

The bit line selected by the bit line selecting and biasing circuit 120 is connected with the page buffer circuit 130. Specifically, the selected bit line is connected to a sensing node SO. During the read operation, the page buffer circuit 130 operates as a sensing circuit for sensing data in a memory cell through the selected bit line. Also, during the write operation, the page buffer circuit 130 operates as a write driver which supplies a program voltage (such as the ground voltage) or a program inhibition voltage (such as the power source voltage) to the selected bit line according to loaded data. The page buffer circuit 130 includes three NMOS transistors 14, 15, and 16, a PMOS transistor 17, and a latch LAT that includes inverters 18 and 19.

The PMOS transistor 17 is connected to both the power source voltage Vdd and the sensing node SO as shown in FIG. 1 and is controlled by the control signal SP. The NMOS transistors 14 and 15 are connected in series between the first latch node ND1 and the ground voltage GND. The NMOS transistor 14 has a gate connected with the sensing node SO, and the NMOS transistor 15 has a gate connected to a control signal LAT. The NMOS transistor 16 is connected to both the sensing node SO and a second latch node ND2 and is controlled by a control signal SEL. The second latch node ND2 is connected to a data line DL through NMOS transistors 20 and 21 constituting a gate array circuit 160.

Still referring to FIG. 1, the bias circuit 150 generates a voltage that is applied to the gate of the NMOS transistor 10 or 11 corresponding to the selected bit line during the read operation. The read operation is divided into a bit line precharge period, a bit line developing period, and a bit line sensing period. The bias circuit 150 generates a voltage higher or lower than the power source voltage Vdd in each of the periods of the read operation, which will be described in detail hereinafter.

Figure 2:
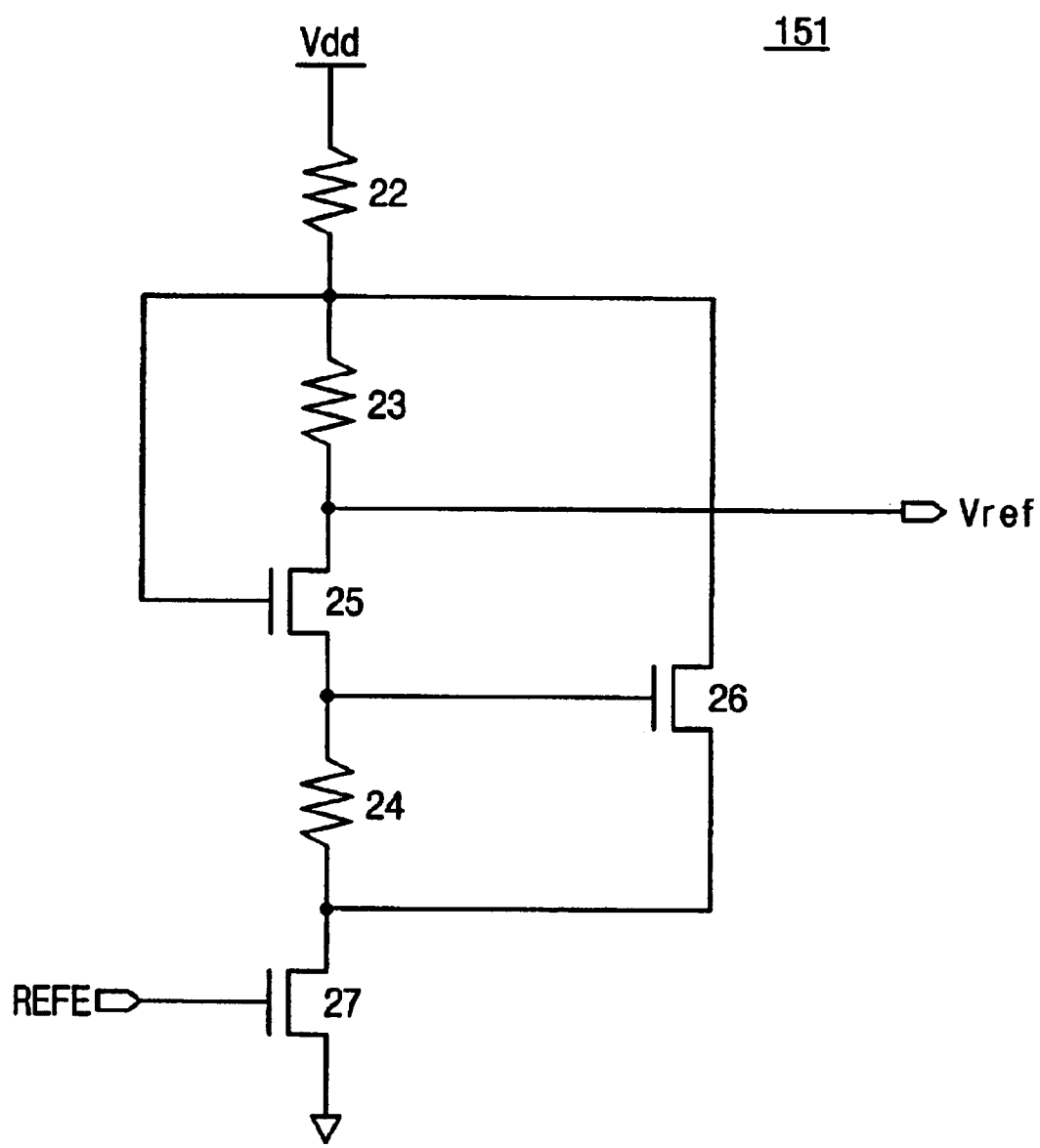
FIG. 2 is a circuit diagram of a reference voltage generation circuit employed in the non-volatile semiconductor memory device shown in FIG. 1.

The bias circuit 150 includes a reference voltage generation circuit 151, a charge pump 152, a first voltage regulator 153, and a second voltage regulator 154. The reference voltage generation circuit 151 generates a reference voltage Vref in response to a control signal REFE. The reference voltage generation circuit 151 includes three resistors 22, 23, and 24 and three NMOS transistors 25, 26, and 27, which are connected in the manner as shown in FIG. 2. When the control signal REFE is in a high level state, the reference voltage generation circuit 151 generates the reference voltage Vref by utilizing the power source voltage Vdd. For example, the reference voltage generation circuit 151 of this embodiment generates a reference voltage of 0.9 V when the power source voltage is 1.6 V. The reference voltage Vref generated in the way described above is supplied simultaneously to both the first voltage regulator 153 and the second voltage regulator 154.

Figure 3:
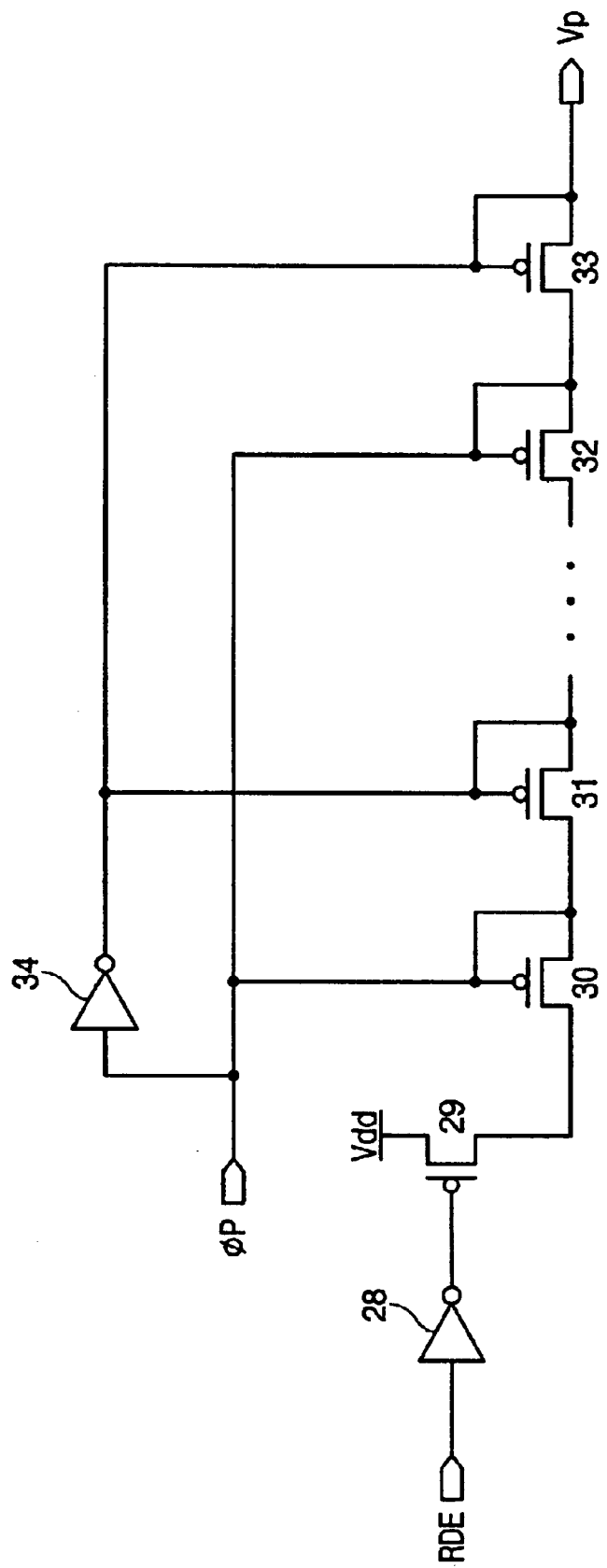
FIG. 3 is a circuit diagram of a charge pump employed in the non-volatile semiconductor memory device shown in FIG. 1.
Figure 4:
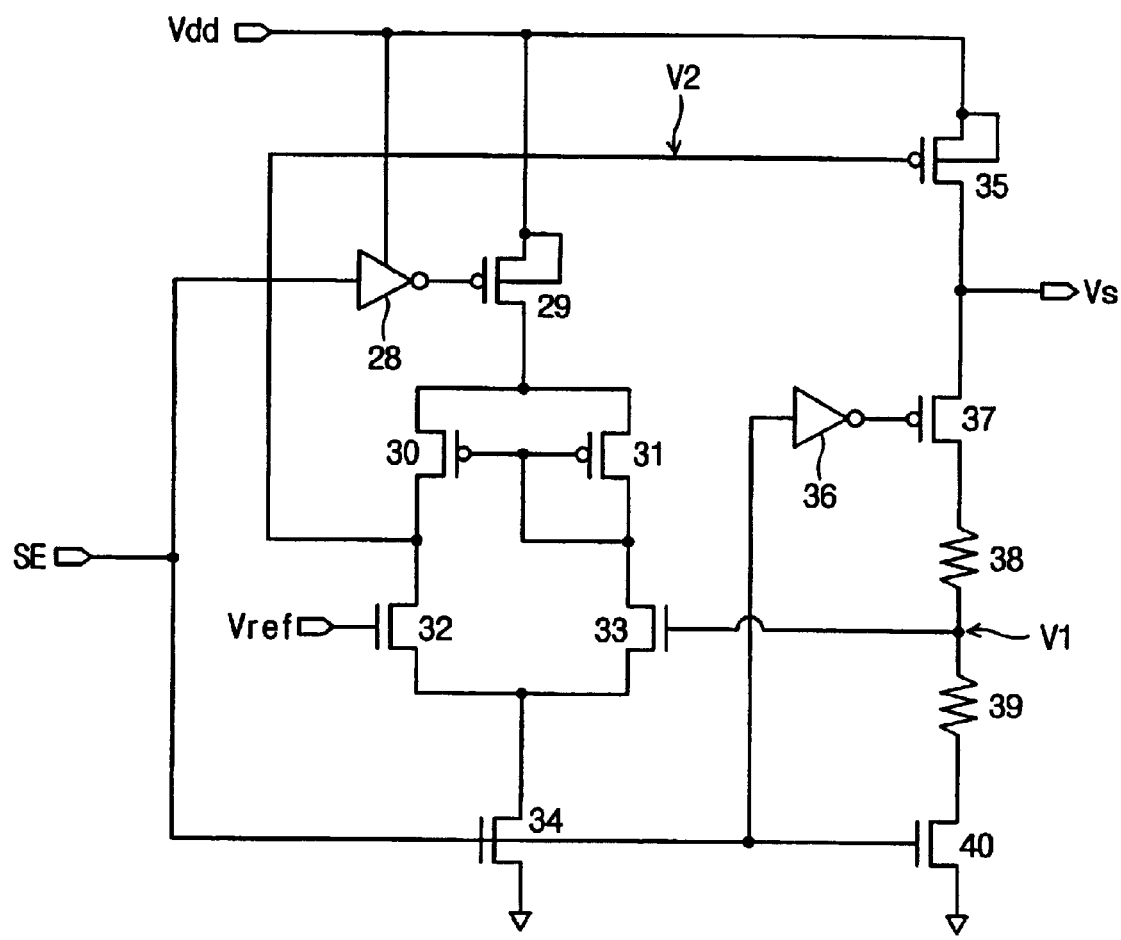
FIG. 4 is a circuit diagram of a first voltage regulator employed in the non-volatile semiconductor memory device shown in FIG. 1.

Referring again to FIG. 1, the charge pump 152 generates a voltage Vp higher than the power source voltage Vdd in response to an oscillation signal φP and a control signal RDE. As illustrated in FIG. 3, the charge pump 152 includes inverters 28 and 34 and PMOS transistors 29, 30, 31, 32, and 33. The charge pump 152, for example, generates a high voltage Vp of 5 V by utilizing the power source voltage Vdd of 1.6 V. The high voltage Vp generated in this way is supplied only to the second voltage regulator 154. As shown in FIG. 1, the first voltage regulator 153 of the bias circuit 150 receives the reference voltage Vref from the reference voltage generation circuit 151 and generates the sensing voltage Vs in response to the control signal SE. In this case, the sensing voltage Vs is less than the power source voltage Vdd (for example, a voltage of 1.3 V when the power source voltage is 1.6 V). As illustrated in FIG. 4, the first voltage regulator 153 includes two inverters 28 and 36, five PMOS transistors 29, 30, 31, 35, and 37, two resistors 38 and 39, and four NMOS transistors 32, 33, 34, and 40.

During operation of the circuit, when the control signal SE representing the sensing period is in a high level state, the PMOS transistor 29 is turned on by the control signal SE transferred through the inverter 28. Then, the power source voltage Vdd is supplied through the turned-on transistor 29 to a differential amplifier (or voltage comparator) consisting of the transistors 30, 31, 32, and 33. According to the operation of the differential amplifier, voltage V1 is compared with the reference voltage Vref. Since the reference voltage Vref is higher than the voltage V1 during an initial operation period of the differential amplifier, the PMOS transistor 35 is turned on. Therefore, the voltage Vs gradually increases and reaches a target voltage owing to the operation of the differential amplifier. More specifically, when the voltage Vs is less than the target voltage, voltage V2 further decreases due to the operation of the differential amplifier to which the V1 voltage is input, thereby strengthening the turn-on state of the PMOS transistor 35. In contrast, when the voltage Vs is greater than the target voltage, the voltage V1 is increased to elevate the voltage V2. As a result, the turn-on state of the PMOS transistor 35 is weakened, so that the voltage Vs decreases. By the repetition of the operation described above, the voltage Vs reaches the target voltage.

Figure 5:
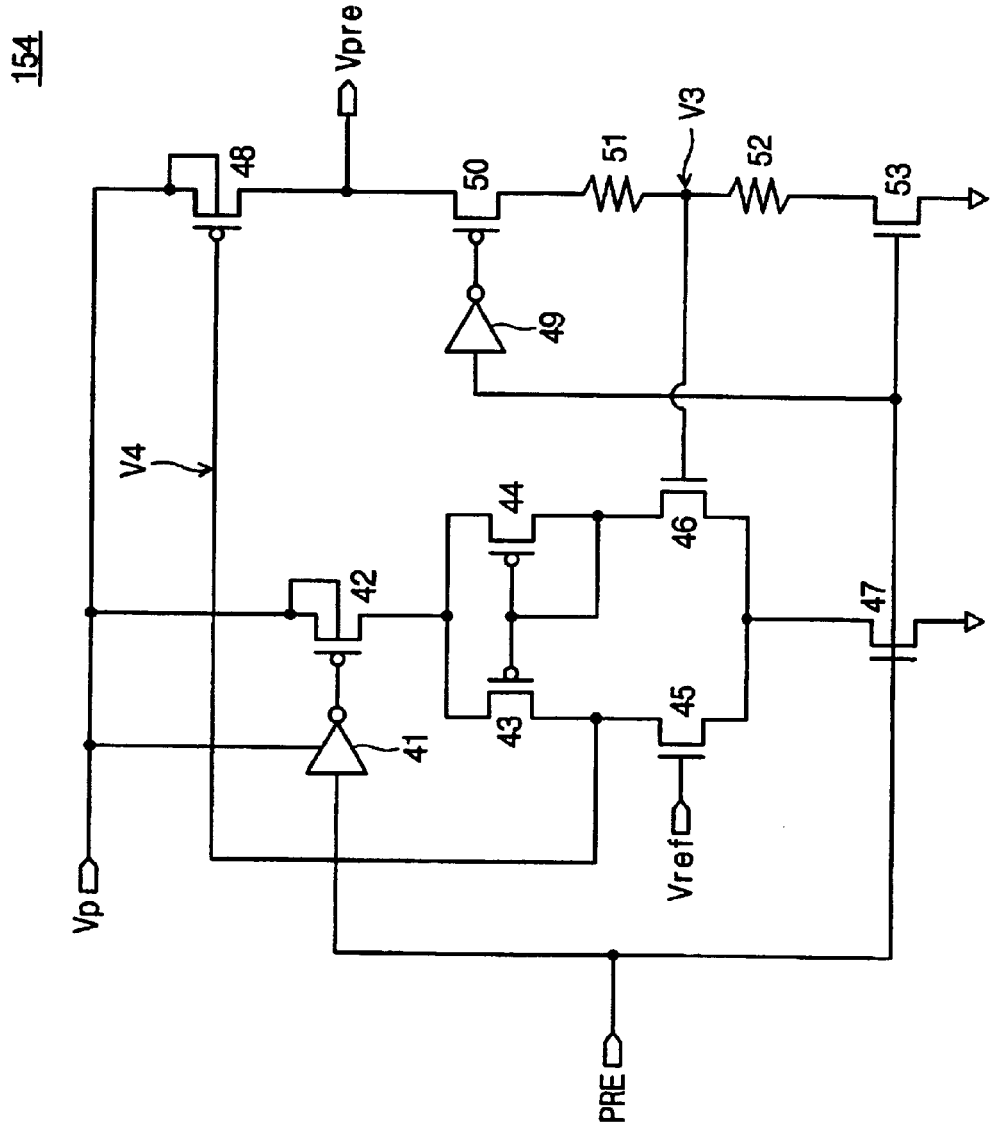
FIG. 5 is a circuit diagram of a second voltage regulator employed in the non-volatile semiconductor memory device shown in FIG. 1.

The second voltage regulator 154 receives both the high voltage Vp generated in the charge pump 152 and the reference voltage Vref generated in the reference voltage generation circuit 151, as shown in FIG. 1. The second voltage regulator 154 generates a precharge voltage Vpre in response to a control signal PRE. In this case, the precharge voltage Vpre is less than the power source voltage Vdd (for example, a voltage of 1.6 V when the power source voltage is 2.1 V). As illustrated in FIG. 5, the second voltage regulator 154 includes two inverters 41 and 49, five PMOS transistors 42, 43, 44, 48, and 50, two resistors 51 and 52, and four NMOS transistors 45, 46, 47, and 53.

During operation of this circuit, when the control signal PRE representing the precharge period is in a high level state, the PMOS transistor 42 is turned on by the control signal PRE transferred through the inverter 41. Then, the high voltage Vp supplied through the turned-on transistor 42 from the charge pump 152 is supplied to a differential amplifier consisting of the transistors 43, 44, 45, and 46. According to the operation of the differential amplifier, a voltage V3 is compared with the reference voltage Vref. Since the reference voltage Vref is higher than the voltage V3 during an initial operation period of the differential amplifier, the PMOS transistor 48 is turned on. Therefore, the voltage Vpre gradually increases and reaches a target voltage through the operation of the differential amplifier. More specifically, when the voltage Vpre is less than the target voltage, voltage V4 further decreases due to the operation of the differential amplifier that has voltage V3 as an input, thereby strengthening the turn-on state of the PMOS transistor 48. In contrast, when the voltage Vpre is greater than the target voltage, the voltage V3 is increased to elevate the voltage V4. As a result, the turn-on state of the PMOS transistor 48 is weakened, and the voltage Vpre decreases. By repetition of the operation described above, the voltage Vpre can reach the target voltage.

As is apparent from the above description, the control signal BLSHFe or BLSHFo that is applied to the gate of the NMOS transistor 10 or 11 has a voltage generated in the bias circuit 150 of Vpre, GND, or Vs. That is, during the precharge period of the read operation or while the control signal PRE that signals the precharge period is maintained in a high level state, a precharge voltage Vpre that is higher than the power source voltage Vdd is generated through the reference voltage generation circuit 151, the charge pump 152, and the second voltage regulator 154 constituting a first voltage generator. The precharge voltage Vpre generated in this way is applied to the signal line BLSHFe or BLSHo connected to the NMOS transistor of the bit line selected by the switch circuit 140. In this case, the signal line connected to the NMOS transistor of the unselected bit line comes to have the ground voltage through the switch circuit 140. During the sensing period of the read operation or while the control signal SE that signals the sensing period is maintained in a high level state, a sensing voltage Vs lower than the power source voltage Vdd is generated through the reference voltage generation circuit 151 and the first voltage regulator 153 constituting a second voltage generator. The sensing voltage Vs generated in this way is applied to the signal line BLSHFe or BLSHo connected to the NMOS transistor of the bit line selected by the switch circuit 140. In this case, the signal line connected to the NMOS transistor of the unselected bit line comes to have the ground voltage.

In the bit line precharge period, since the gate voltage of the NMOS transistor 10 or 11 is higher than the power source voltage Vdd, the selected bit line can be rapidly precharged to a relatively high voltage. As a result, the drain-source voltage of the memory cell is increased. According to the increase of the drain-source voltage of the memory cell, the cell current flowing through the memory cell also increases. This means that the length of time which it takes while the voltage of the bit line is developed is relatively shortened. In conclusion, the read time may be prevented from increasing as the operation voltage decreases.

Figure 6:
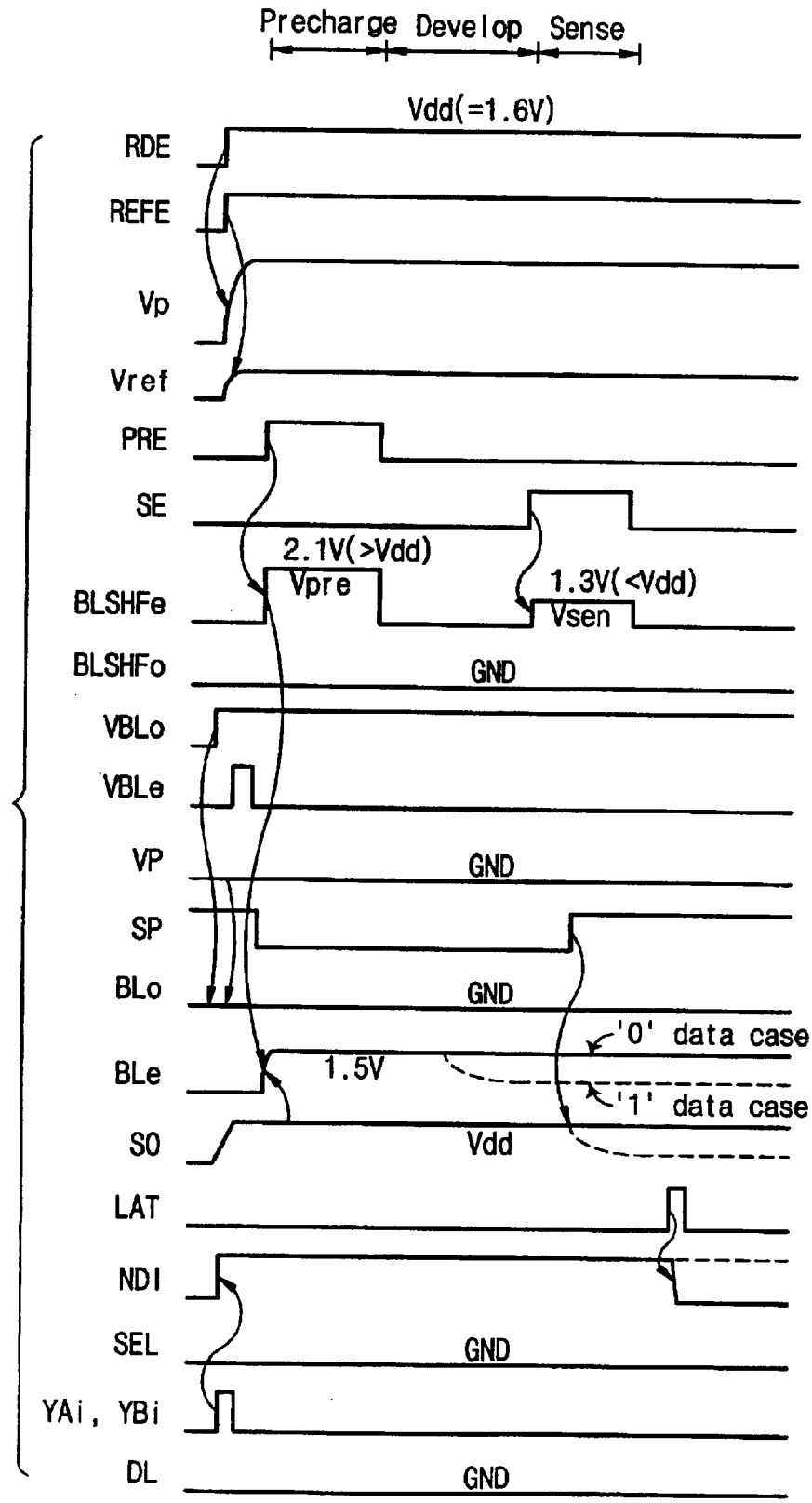
FIG. 6 is a timing diagram illustrating a read operation of a non-volatile semiconductor memory device according to embodiments of the invention.

FIG. 6 is a timing diagram illustrating a read operation of a non-volatile semiconductor memory device according to the embodiment of the invention. Hereinafter, the read operation of a non-volatile semiconductor memory device according to the embodiment will be described in detail with reference to accompanying drawings. For ease of description, the following discussion will be based on assumptions that the bit line BLe is selected, the signal line BLSHFe receives an output voltage of the bias circuit 150 through the switch circuit 140, and the signal line BLSHo is grounded through the switch circuit 140.

A control signal RDE that signals the read operation shifts from a low level to a high level, and simultaneously a control signal REFE that activates the reference voltage generation circuit 151 shifts from a low level to a high level. In response to the low-to-high transition of the control signal REFE, the reference voltage generation circuit 151 generates a reference voltage Vref (about 0.9 V in the present embodiment). In response to an oscillation signal φP in the course of the low-to-high transition, the charge pump 152 generates a high voltage Vp (about 5 V in the present embodiment). At the same time, both of the bit lines BLe and BLo are discharged to 0 V. That is, 0 V is supplied to a voltage supply line VP and the power source voltage Vdd is supplied to the signal lines VBLe and VBLo, so that the bit lines BLe and BLo are electrically connected with the voltage supply line VP of 0 V. As a result, both of the bit lines BLe and BLo are discharged to 0 V.

In the embodiment, as shown in FIG. 6, although the signal VBLe that is applied to the gate of the NMOS transistor 10 is maintained in a high level state only for a predetermined period of time, the signal VBLo that is applied to the gate of the NMOS transistor 11 is continuously maintained in a high level state. This means that the unselected bit line BLo is at the ground voltage during the read operation. In order to store data that will be read thereafter, the second latch node ND2 of the page buffer circuit 130 is discharged to 0 V so that the first latch node ND1 of the page buffer circuit 130 is at the high level power source voltage Vdd. For example, by activating line selection signals YAi and YBi in a state where the data line DL is maintained at 0 V, the second latch node ND2 is discharged to 0 V.

When the operation described above is complete, data is read from a memory cell selected through the following steps. The first step is a precharge step in which a selected bit line BLe is charged, the second step is a developing step in which a voltage level of the selected bit line BLe is either reduced or maintained as it is, according to a state of the memory cell, and the third step is a step in which a voltage of the selected bit line BLe is sensed.

First, in order to charge the selected bit line BLe to a predetermined voltage, the control signal SP is shifted from a high level to a low level. As a result, the sensing node SO is charged to the power source voltage Vdd through the PMOS transistor 17. Simultaneously, the control signal PRE that signals the precharge period is shifted from a low level to a high level. The control signal PRE is maintained at the high level for a predetermined period of time. When the control signal PRE is in the high level, the second voltage regulator 154 generates a precharge voltatge Vpre (for example, 2.1 V) greater than the power source voltage Vdd (for example, 1.6 V) by means of the high voltage Vp from the charge pump 152. The voltage Vpre generated in this way is transferred to the signal line BLSHFe through the switch circuit 140. The NMOS transistor 10 is turned on by the control signal BLSHFe having the voltage Vpre, and a predetermined current is supplied from the sensing node SO to the bit line BLe through the turned-on transistor 10. The precharge voltage of the bit line BLe has a value obtained by subtracting a threshold voltage of the transistor 10 from a gate voltage of the transistor 10. For example, when the threshold voltage Vth of the transistor 10 is 0.6 V, the precharge voltage of the bit line BLe is 1.5 V (Vpre−Vth=2.1 V−0.6 V).

As the control signal PRE is shifted from a high level to a low level, the second voltage regulator 154 is inactivated. In this case, as stated above, the switch circuit 140 causes the signal line BLSHFe to have 0 V, and thereby the precharged bit line BLe is electrically disconnected from the sensing node SO. On this condition, according to on/off states of the memory cell connected to the selected bit line BLe, the voltage of the bit line BLe will either be reduced or maintained as it is. If the selected memory cell stores "0" data, the memory cell is in an OFF state, and the precharge voltage (1.5 V) of the bit line BLe is maintained as it is as shown by a solid line in FIG. 6. If the selected memory cell stores "1" data, the memory cell is in an ON state, and the bit line BLe having the precharge voltage (1.5 V) is grounded through the memory cell. That is, the precharge voltage of the bit line BLe is gradually lowered from 1.5 V to the ground voltage GND as shown by a broken line in FIG. 6. Through the developing process as described above, the voltage level of the selected bit line BLe will be determined.

When the developing process of the bit line BLe has been completed, the control signal SE informing the sensing period is shifted from a low level to a high level as shown in FIG. 6. In response to the control signal SE at the high level, 153 generates a sensing voltage Vsen (for example, 1.3 V) lower than the power source voltage Vdd (for example, 1.6 V). The sensing voltage Vsen generated in this way is transferred to the signal line BLSHFe through the switch circuit 140. The NMOS transistor 10 is turned on by a control signal BLSHFe having the voltage Vs. In this case, the NMOS transistor 10 is turned on or off according to the voltage of the bit line BLe.

In the case where a memory cell in an OFF state is connected with the bit line BLe, the bit line BLe has a precharged voltage at an initial stage. The sensing node SO has a power source voltage Vdd, the bit line BLe has a voltage of about 1.5 V, and the NMOS transistor 10 has a gate voltage of 1.3 V. Therefore, the NMOS transistor 10 is shut off. As a result, the voltage of the sensing node SO is maintained at the power source voltage as shown by the solid line in FIG. 6. In contrast, when a memory cell in an ON state is connected with the bit line BLe, the bit line BLe has a voltage which is gradually lowered from the initial precharged voltage, so that the NMOS transistor 10 is turned on. As the voltage of the sensing node SO is gradually lowered from the power source voltage Vdd toward the ground voltage as shown by the broken line in FIG. 6.

In the former case, since the voltage of the sensing node SO is maintained at the power source voltage Vdd, the NMOS transistor 14 is turned on. As the control signal LAT is activated to have a pulse shape, the first latch node ND1 is connected with the ground voltage GND through the turned-on transistors 14 and 15. In the latter case, since the voltage of the sensing node SO comes to be lower than the threshold voltage of the transistor 14, the NMOS transistor 14 is turned off. Even though the control signal LAT is activated to have a pulse shape, the voltage of the first latch node ND1 is maintained at the voltage set in the first stage. Through this process, the data stored in the memory cell is sensed and latched. Finally, the data sensed and latched in the way described above is transferred through the gate array circuit 160 to the data line DL.

In a low-voltage non-volatile semiconductor memory device according to the embodiment described above, a gate voltage of an NMOS transistor connected to both a bit line and a sensing circuit is set to be higher than a power source voltage Vdd in a precharge period of a selected bit line, so that the selected bit line can be rapidly precharged to a relatively high voltage. As a result, when the memory device is operated with a low power source voltage, a drain-source voltage of a memory cell relatively increases. According to the increase of the drain-source voltage of the memory cell, the cell current flowing through the memory cell also increases. This means that the length of time that it takes to develop the voltage of the bit line is relatively shortened. In conclusion, the read time is prevented from increasing as the operation voltage is lowered.

In summary, embodiments of the invention provide a non-volatile semiconductor memory device with a memory cell array that includes a number of word lines, a number of pairs of bit lines, and a number of memory cells arranged on intersecting points of the word lines and bit lines. A number of bit line selecting and biasing circuits are connected to each pair of the bit lines and selects one bit line from among said pair of the bit lines. A number of page buffer circuits correspond to the bit line selecting and biasing circuits, respectively, and each of the page buffer circuits reads data from the memory cell array through a bit line selected by a corresponding bit line selecting and biasing circuit. Each of the bit line selecting and biasing circuits includes a first and a second transistor. The first transistor is connected to both a first bit line and a corresponding page buffer circuit, and the second transistor is connected to both a second bit line and the corresponding page buffer circuit. The first and second bit lines constitute a pair of bit lines corresponding to the page buffer circuit. A bias circuit generates a bias voltage during the read operation. A switch circuit receives the bias voltage and generates first and second bias signals. The first and second bias signals are used to control the first and second transistors of each of the bit line selecting and biasing circuits, respectively. The switch circuit loads the bias voltage to one of the first and second bias signals. The bias signal generated by the bias circuit has a first voltage higher than a power source voltage in a precharge period of the read operation, and has a second voltage lower than the power source voltage in a sensing period of the read operation.

In this embodiment the bias circuit includes a reference voltage generation circuit receiving a power source voltage and generating a reference voltage lower than the power source voltage; a charge pump receiving the power source voltage and generating a high voltage higher than the power source voltage; a first voltage regulator receiving the reference voltage and the power source voltage and generating a first voltage as the bias voltage in response to a first flag signal, the first voltage being lower than the power source voltage; and a second voltage regulator receiving the reference voltage, the power source voltage, and the high voltage, the second voltage regulator generating a second voltage as the bias voltage in response to a second flag signal, the second voltage being higher than the power source voltage.

Although an exemplary embodiment of the invention has been disclosed for illustrative purposes, those skilled in the art will appreciate that various modifications, additions and substitutions are possible, without departing from the scope and spirit of the invention as described in the accompanying claims. For example, the bias circuit shown in FIG. 1 may be employed even in a semiconductor memory device having a construction in which one page buffer circuit is connected to one bit line.

What is claimed is:

1. A non-volatile semiconductor memory device comprising:
   a bit line connected to a memory cell;
   a sensing circuit that senses data stored in the memory cell;
   a transistor connected to both the bit line and the sensing circuit, the transistor controlled by a predetermined bias signal; and
   a bias circuit generating the predetermined bias signal in response to a control signal for a read operation, wherein
   the predetermined bias signal has a first voltage greater than a power source voltage during a precharge period of the read operation, and the predetermined bias signal has a second voltage less than the power source voltage during a sensing period of the read operation.

2. The device of claim 1, wherein the bias circuit comprises:
   an output node;
   a first voltage generation section connected to the output node, the first voltage generation section generating the first voltage in response to a first flag signal; and
   a second voltage generation section connected to the output node, the second voltage generation section generating the second voltage in response to a second flag signal, wherein the first and second voltages are transferred to the output node.

3. A non-volatile semiconductor memory device comprising:
- a bit line connected to a memory cell;
- a sensing circuit configured to sense data stored in the memory cell;
- a transistor connected to both the bit line and the sensing circuit, the transistor controlled by a predetermined bias voltage; and
- a bias circuit configured to generate the predetermined bias voltage in response to a read operation control signal, wherein the bias circuit includes
- a reference voltage generation circuit configured to receive a power source voltage and to generate a reference voltage that is lower than the power source voltage,
- a charge pump configured to receive the power source voltage and to generate a high voltage that is greater than the power source voltage,
- a first voltage regulator configured to receive the reference voltage and the power source voltage and to generate a first voltage less that is less than the power source voltage that functions as the predetermined bias voltage in response to a first flag signal, and
- a second voltage regulator configured to receive the reference voltage, the power source voltage, and the high voltage, the second voltage regulator configured to generate a second voltage that is higher than the power source voltage that functions as the predetermined bias voltage in response to a second flag signal.

4. The device of claim 3, wherein the predetermined bias voltage has a ground voltage during a developing period of the read operation.

5. A non-volatile semiconductor memory device comprising:
- a memory cell array comprising a plurality of word lines, a plurality of bit lines arranged in at least one bit line pair, and a plurality of memory cells arranged on intersecting points of the word lines and bit lines;
- a bit line selecting and biasing circuit connected to the at least one bit line pair that selects a first bit line from the at least one bit line pair;
- a page buffer circuit corresponding to the bit line selecting and biasing circuit that reads data from the memory cell array through the first bit line from the at least one bit line pair;
- a first and a second transistor included in the bit line selecting and biasing circuit, the first transistor connected to the first bit line from the at least one bit line pair and the page buffer circuit, the second transistor connected to a second bit line from the at least one bit line pair and the page buffer circuit;
- a bias circuit that generates a bias voltage during the read operation; and
- a switch circuit that receives the bias voltage and generates first and second bias signals that control the first and second transistors, respectively, wherein the bias voltage has a first voltage less than a power source voltage in a precharge period of the read operation and has a second voltage greater than the power source voltage in a sensing period of the read operation.

6. The device of claim 5, wherein the bias circuit comprises:
- a reference voltage generation circuit that receives a power source voltage and generates a reference voltage less than the power source voltage;
- a charge pump that receives the power source voltage and generates a high voltage greater than the power source voltage;
- a first voltage regulator that receives the reference voltage and the power source voltage and generates the first voltage in response to a first flag signal; and
- a second voltage regulator that receives the reference voltage, the power source voltage, and the high voltage, and that generates the second voltage in response to a second flag signal.

7. The device of claim 5, wherein the switch circuit maintains the first and second bias signals at a low level during a developing period of the read operation.

* * * * *